United States Patent [19]

Matsumoto

[11] Patent Number: 4,875,192
[45] Date of Patent: Oct. 17, 1989

[54] SEMICONDUCTOR MEMORY WITH AN IMPROVED NIBBLE MODE ARRANGEMENT

[75] Inventor: Tetsuro Matsumoto, Tachikawa, Japan

[73] Assignee: Hitachi, Ltd., Tokyo, Japan

[21] Appl. No.: 127,621

[22] Filed: Nov. 30, 1987

Related U.S. Application Data

[63] Continuation of Ser. No. 685,553, Dec. 24, 1984, abandoned.

[30] Foreign Application Priority Data

Dec. 23, 1983 [JP] Japan ................................ 58-241966

[51] Int. Cl.$^4$ .......................... G11C 7/00; G11C 8/00
[52] U.S. Cl. .................................. 365/193; 365/233; 365/233.5
[58] Field of Search ............... 365/189, 190, 193, 203, 365/230, 233, 239, 240

[56] References Cited

U.S. PATENT DOCUMENTS

| | | | |
|---|---|---|---|
| 4,272,832 | 6/1981 | Ito ........................................ | 365/233 |
| 4,338,679 | 7/1982 | O'Toole ............................... | 365/203 |
| 4,344,156 | 8/1982 | Eaton, Jr. et al. .................... | 365/189 |
| 4,397,001 | 8/1983 | Takemae ............................... | 365/193 |
| 4,405,996 | 9/1983 | Stewart ................................. | 365/189 |
| 4,429,375 | 1/1984 | Kobayashi et al. ................... | 365/240 |
| 4,472,792 | 9/1984 | Shimohigashi et al. .............. | 365/189 |
| 4,567,579 | 1/1986 | Patel et al. ............................ | 365/189 |
| 4,602,353 | 7/1986 | Wawersig et al. .................... | 365/193 |
| 4,707,811 | 11/1987 | Takemae et al. ..................... | 365/233 |

FOREIGN PATENT DOCUMENTS

| | | | |
|---|---|---|---|
| 0027477 | 2/1982 | Japan ..................................... | 365/230 |
| 0062885 | 4/1983 | Japan ..................................... | 365/230 |
| 0220294 | 12/1983 | Japan ..................................... | 365/230 |

OTHER PUBLICATIONS

Fujishima et al., "A 256K Dynamic RAM with Page-Nibble Mode", IEEE Journal of Solid State Circuits, vol. SC-18, No. 5, Oct. 1983, pp. 470-478.

Primary Examiner—Stuart N. Hecker
Assistant Examiner—Glenn A. Gossage
Attorney, Agent, or Firm—Antonelli, Terry & Wands

[57] ABSTRACT

A dynamic semiconductor memory includes a shift register which enables a nibble operation to be carried out, and a timing generator. The timing generator detects every transient state of the column address strobe signals to form shift pulses that are to be supplied to said shift register, as well as timing signals that are to be supplied to various internal circuits. The dynamic semiconductor memory having such a timing generator operates at high speeds, since it is accessed by the cycle number with a small change of the column address strobe signals.

15 Claims, 4 Drawing Sheets

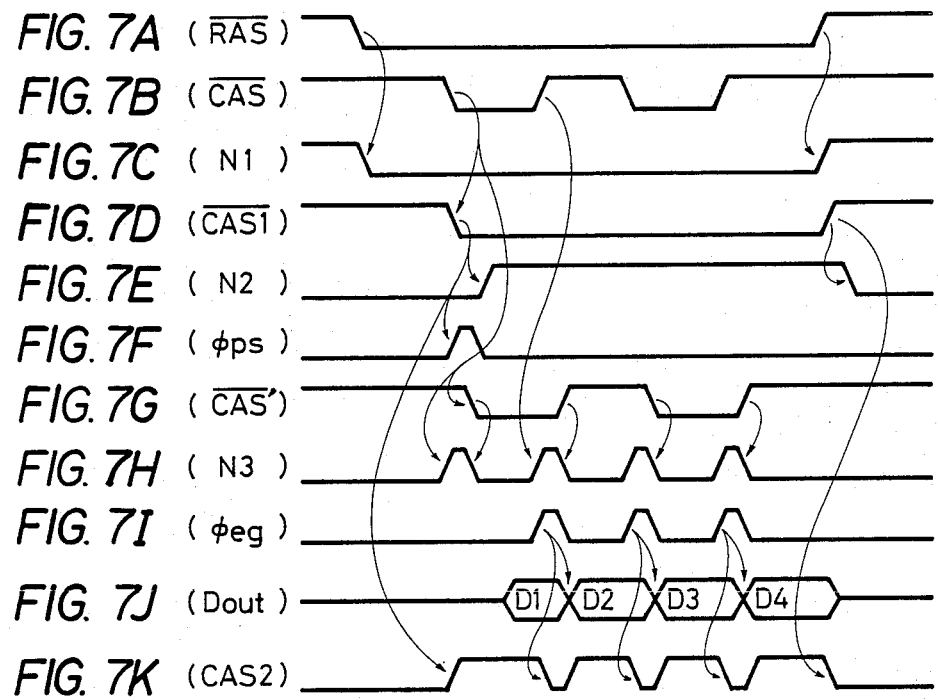
FIG. 7A (RAS)
FIG. 7B (CAS)
FIG. 7C (N1)
FIG. 7D (CAS1)
FIG. 7E (N2)
FIG. 7F (φps)
FIG. 7G (CAS')
FIG. 7H (N3)
FIG. 7I (φeg)
FIG. 7J (Dout)
FIG. 7K (CAS2)
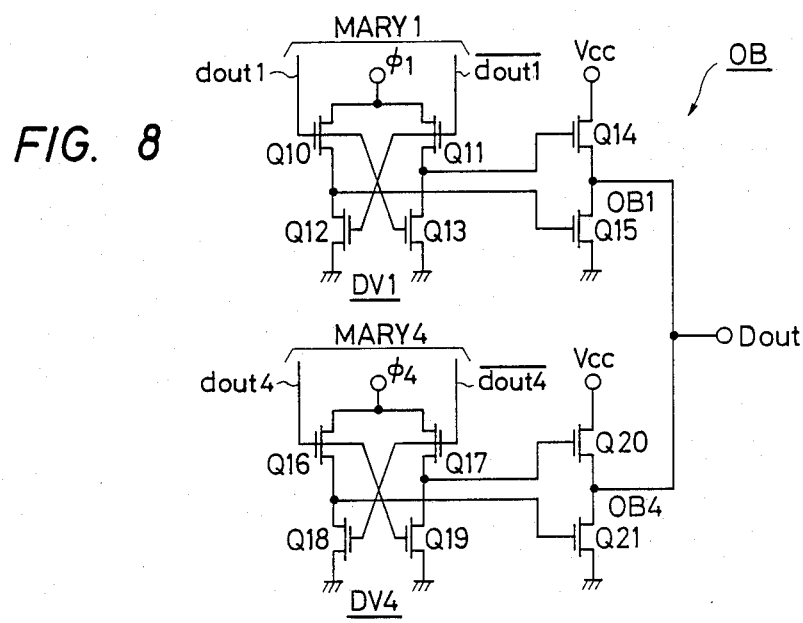
FIG. 8

SEMICONDUCTOR MEMORY WITH AN IMPROVED NIBBLE MODE ARRANGEMENT

This application is a continuation of application Ser. No.685,553, filed on Dec. 24, 1984 now abandoned.

BACKGROUND OF THE INVENTION

The present invention relates to a semiconductor memory, and particularly to an art which is effective for a semiconductor memory having a function (nibble mode) to serially write or read data consisting of a plurality of bits.

In a dynamic RAM (random access memory), for instance, there has been proposed an access system called the nibble mode in addition to a system which accesses the data with a unit of one bit. FIG. 1 shows a timing chart of signals in the nibble mode in accordance with the conventional technique. To access the RAM, a row address strobe signal $\overline{RAS}$ and a column address signal $\overline{CAS}$ are caused to drop to the low level as shown. The column address strobe signal $\overline{CAS}$ is caused to drop several times as shown. In synchronism with the first fall of the signals $\overline{RAS}$ and $\overline{CAS}$, the RAM takes in a pair of address signals, i.e., takes in a row address signal and a column address signal. The RAM which is capable of performing the nibble operation contains a plurality of signal holder circuits, a shift register for controlling their operation, and registers. When the address of one time is set, data consisting of four bits is given to the signal holder circuits in the RAM. The data consisting of four bits in outputted from the RAM one bit at a time in synchronism with the fall of column address strobe signal $\overline{CAS}$ as shown in the timing chart of FIG. 1.

In the dynamic RAM of this type, when an internal circuit such as a timing generator circuit is constituted by a dynamic circuit, such an internal circuit is rendered to assume a precharged state or a reset state when the column address strobe signal $\overline{CAS}$ assumes the high level, and forms various signals when the column address strobe signal $\overline{CAS}$ assumes the low level.

Here, a minimum pulse width of the column address strobe signal $\overline{CAS}$ which assumes the high level, is usually limited depending upon a system clock of an electronic system which makes use of the RAM. Therefore, when the precharging period is set depending upon the high level of the column address strobe signal $\overline{CAS}$, the access time of the RAM tends to be delayed.

SUMMARY OF THE INVENTION

An object of the present invention is to provide a semiconductor memory which is capable of receiving and producing data consisting of a plurality of bits at a high speed.

The above and other objects as well as novel features of the invention will become obvious from the description of the specification and the accompanying drawings.

To accomplish the above and other objects, inputting and outputting of data for memory arrays is executed serially in synchronism with change timing of column address strobe signals to realize a very high speed access.

BRIEF DESCRIPTION OF THE DRAWINGS

FIGS. 7A–7K represent a timing chart for explaining the operation of the circuits of FIGS. 3 and 6; and FIG. 8 is a circuit diagram of a data output buffer according to another embodiment of the invention.

DESCRIPTION OF THE PREFERABLE EMBODIMENT

Figure 1:
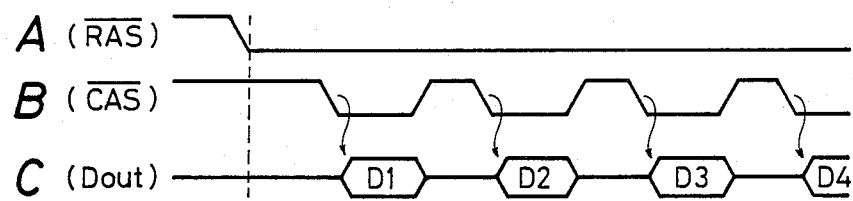
FIG. 1 is a timing chart for illustrating a previously proposed nibble mode arrangement.
Figure 2:
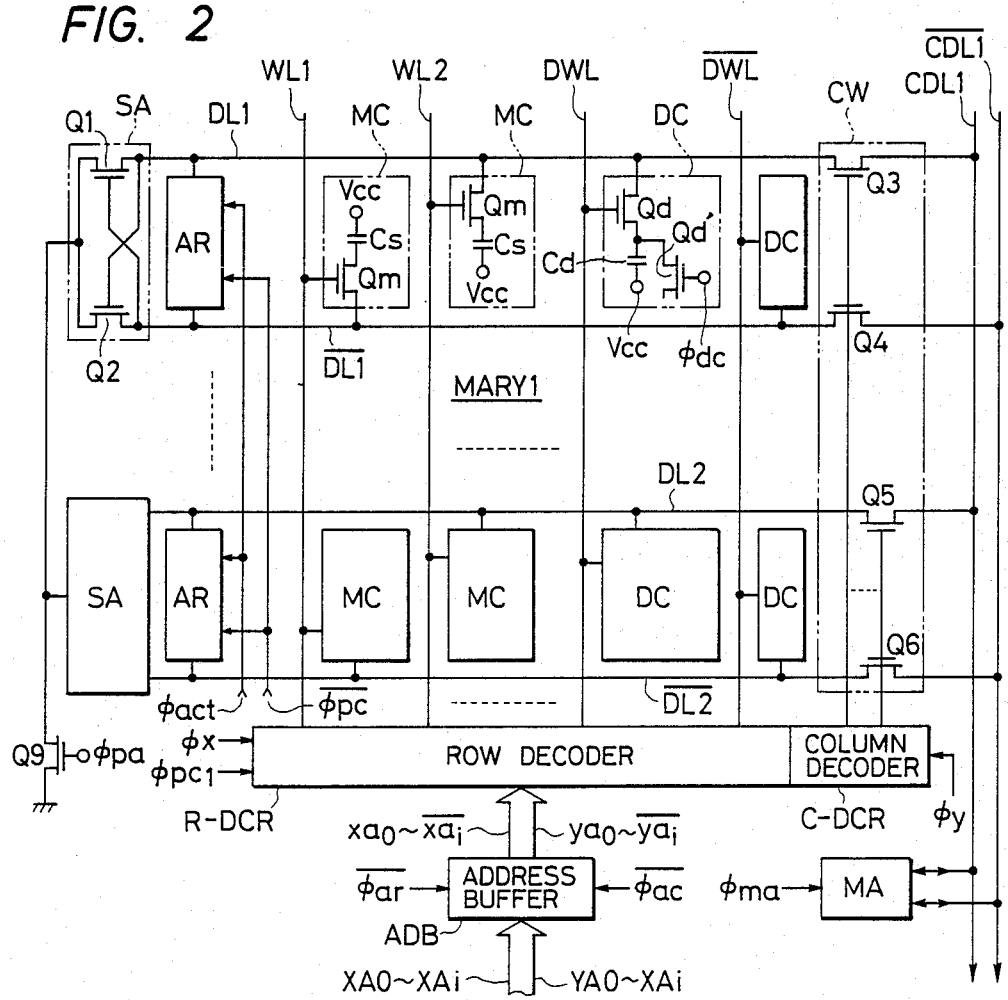
FIG. 2 is a circuit diagram which illustrates an embodiment of the present invention.

FIG. 2 is a circuit diagram of an embodiment in which the present invention is adapted to a dynamic RAM. Though there is no particular limitation, the dynamic RAM of this embodiment has four memory arrays MARY1 to MARY4 (noting only MARY 1 is shown for purposes of drawing simplification) and peripheral circuits consisting of sense amplifier SA connected to each of the memory arrays, active restore circuits AR, a column switching circuit CW, a main amplifier MA, a row and column address decoder RC-DCR, an address amplifier ADB, and a timing generator circuit (noting that only timing signals are shown in FIG. 2, with the timing generator being illustrated in detail in FIG. 6).

The four memory arrays have memory addresses that are corresponded to one another. The peripheral circuits such as address decoders, column switching circuits and the like connected to the four memory arrays, are suitably constituted, so that the corresponding memory addresses in the four memory arrays are selected simultaneously.

To simplify the drawing, FIG. 2 representatively shows only one memory array MARY1 among a plurality of memory arrays and peripheral circuits thereof. These memory arrays and peripheral circuits have been found on a semiconductor substrate by well-known techniques for producing semiconductor integrated circuits.

The circuit of the embodiment shown in FIG. 2 is made up of IGFET's (insulated gate field effect transistors) as represented by n-channel MOSFETs.

The memory array MARY1 consists of a plurality of data lines (bit lines) DL1 to $\overline{DL2}$, word lines WL1, WL2, and memory cells MC. Though there is no particular limitation, the memory array MARY1 is based upon the folded bit line construction. The data lines DL1 and $\overline{DL1}$ that are neighboring relative to each other and that stretch in parallel with each other, form a pair relative to each other. A memory cell MC is connected to one of the two intersecting points formed by the pair of data lines DL1, $\overline{DL1}$, and a word line WL1.

The memory cell MC of one bit consists of a data-storing capacitor Cs and an address-selecting MOSFET Qm. Data of logic level "1" or "0" is stored in the form of whether there is the electric charge in the capacitor Cs or not.

The data is read out by rendering the MOSFET Qm conductive to connect the capacitor Cs to a common data line DL, and by sensing how the potential of the data line DL is changed depending upon the amount of electric charge stored in the capacitor Cs. The potential change, i.e., the level of data signal applied to the data line DL from the selected memory cell MC, is very small since the data line DL has relatively large parasitic capacity.

Though there is no particular limitation, provision is made of a dummy cell DC as a reference to detect such a very small signal. The dummy cell DC is formed under the same manufacturing conditions as the memory cell MC and to have the same design constant, with the exception that the capacitor Cd thereof has a capacity nearly one-half that of the capacitor Cs of the memory cell MC. Prior to the addressing, the capacitor Cd is electrically charged to ground potential through the MOSFET Qd'.

Since the capacity of the capacitor Cd has been set to about one-half against that of the capacitor Cs, the dummy cell CD applies a reference voltage nearly equal to one-half the read signal applied to one of the pair of data lines from the memory cell MC, to the other line of the pair of data lines.

Memory cells are connected in an equal number to the complementary data lines DL, $\overline{DL}$ to increase the precision of detection or, in other words, to equalize the parasitic capacities coupled to each of the complementary data lines DL and $\overline{DL}$. A dummy cell is coupled to each of the data lines DL, $\overline{DL}$. Further, each memory cell MC is connected between a word line WL and one of the pair of complementary data lines, as mentioned earlier.

In effecting the addressing, when a memory cell MC connected to either one of the pair of complementary data lines DL, $\overline{DL}$ is selected, one of the pair of dummy word lines DWL, $\overline{DWL}$ is selected such that the dummy cell DC is necessarily coupled to the other data line.

The sense amplifier SA expands the difference of potential change caused by the addressing to a sense period determined by a timing signal (sense amplifier control signal) $\phi_{pa}$. A pair of input/output nodes of the sense amplifier SA are connected to the pair of complementary data lines DL, $\overline{DL}$ that are arranged in parallel with each other. The sense amplifier SA has a pair of MOSFETs Q1, Q2 that are connected in a cross manner, and differentially amplifies a very small signal appearing on the complementary data lines DL, $\overline{DL}$ relying upon the function of positive feedback.

Each of the word lines WL intersects the pair of data lines, and undesired coupling capacity is formed between each of the word lines and the data lines. Therefore, when a word line is selected, noise is applied to the data lines via the coupling capacities. In the memory array of the folded bit line construction, however, noises of an equal level are applied from the word line to the pair of data lines DL, $\overline{DL}$ via the coupling capacities. These noises are common-mode noises that can be cancelled by the sense amplifier SA of the differential type.

At the time of addressing, the data stored in the memory cell MC which is just going to be destroyed is restored by simply receiving the potential of high level or low level obtained by the sense operation.

However, if the high level set by the operation of the sense amplifier SA drops by more than a predetermined amount with respect to the power source voltage $V_{CC}$, then the high level may be erroneously read as the logic level "0" after the reading and writing operations are repeated several times. The active restore circuit AR is provided to prevent the above-mentioned erroneous operation. The active restore circuit AR works to selectively boost the only signals of the high level to the power source voltage $V_{CC}$ without effecting the signals of the low level.

The pair of data lines DL1, $\overline{DL1}$ shown in FIG. 2 are connected to a pair of common complementary data lines CDL1, $\overline{CDL1}$ via MOSFETs Q3, Q4 which constitute a column switch. Other parts of data lines have also been connected to the pair of common complementary data lines CDL1, $\overline{CDL1}$ via similar MOSFETs, Q5, Q6. The pair of common complementary data lines CDL1, $\overline{CDL1}$ are connected to the input terminal of a data output circuit and to the output terminal of a data input circuit that will be described later with reference to FIG. 3. The common complementary data lines CDL1, $\overline{CDL1}$ are also coupled to a pair of input/output terminals of the main amplifier MA.

Upon receipt of an internal complementary address signal formed by the addressed buffer ADB, the row and column decoder RC-DCR forms signals to select a word line, a dummy word line and a column switch. Therefore, the addressing is effected for the memory cells and dummy cells.

The address buffer ADB, row decoder and column decoder RC-DCR can be constructed in the same manner as that well known for available dynamic RAMs. Therefore, they are not described here in great detail. However, to describe these circuits briefly, they are made up of circuits of dynamic operation, and are controlled for their operation by various timing signals produced by a timing generator that will be mentioned later. That is, the address buffer ADB takes in external address signals XA0 to XAi in synchronism with a timing signal $\phi_{ar}$ formed by a row address strobe signal $\overline{RAS}$, and produces internal complementary address signals $ax_0$, $\overline{ax_0}$ to $ax_i$, $\overline{ax_i}$. The address buffer ADB further takes in external address signals YA0 to YAi in synchronism with a timing signal $\phi_{ac}$ formed by column address strobe signal $\overline{CAS}$, and produces internal complementary address signals $ya_0$, $\overline{ya_0}$ to $ya_i$, $\overline{ya_i}$. Though there is no particular limitation, the signals $ax_i$ and $\overline{ax_i}$ among the internal complementary address signals $ax_0$ to $\overline{ax_i}$ of the row system are supplied to an address decoder SR-CDR that will be described later with reference to FIG. 3. The remaining internal complementary address signals $ax_0$, $\overline{ax_0}$ to $ax_{i-1}$, $\overline{ax_{i-1}}$ are supplied to the row decoder R-DCR. Similarly, the signals $ay_i$ and $\overline{ay_i}$ among the internal complementary address signals $ay_0$, $\overline{ay_0}$ to $ay_i$, $\overline{ay_i}$ of the column system are supplied to the address decoder SR-DCR, and the remaining address signals $ay_0$, $\overline{ay_0}$ to $\overline{ay_{i-1}}$ are supplied to the column decoder C-DCR.

The row address decoder R-DCR receives a word line select timing signal $\phi_x$ formed based upon the row address strobe signal and the internal complementary address signals, and selects a word line and a dummy line designated by the address signals XA0 to XAi-1 in synchronism with the timing signals $\phi_x$.

The column decoder C-DCR receives a data line select timing signal $\phi_y$ formed based upon the column address strobe signal $\overline{CAS}$ and the internal complementary address signals, and selects a data line designated by the address signals YA0 to YAi-1 in synchronsim with the data line select signal $\phi_y$.

The main amplifier MA is controlled for its operation by a timing signal $\phi_{ma}$ and amplifies the data signals applied to the common complementary data lines CDL1 and $\overline{CDL1}$.

Figure 3:
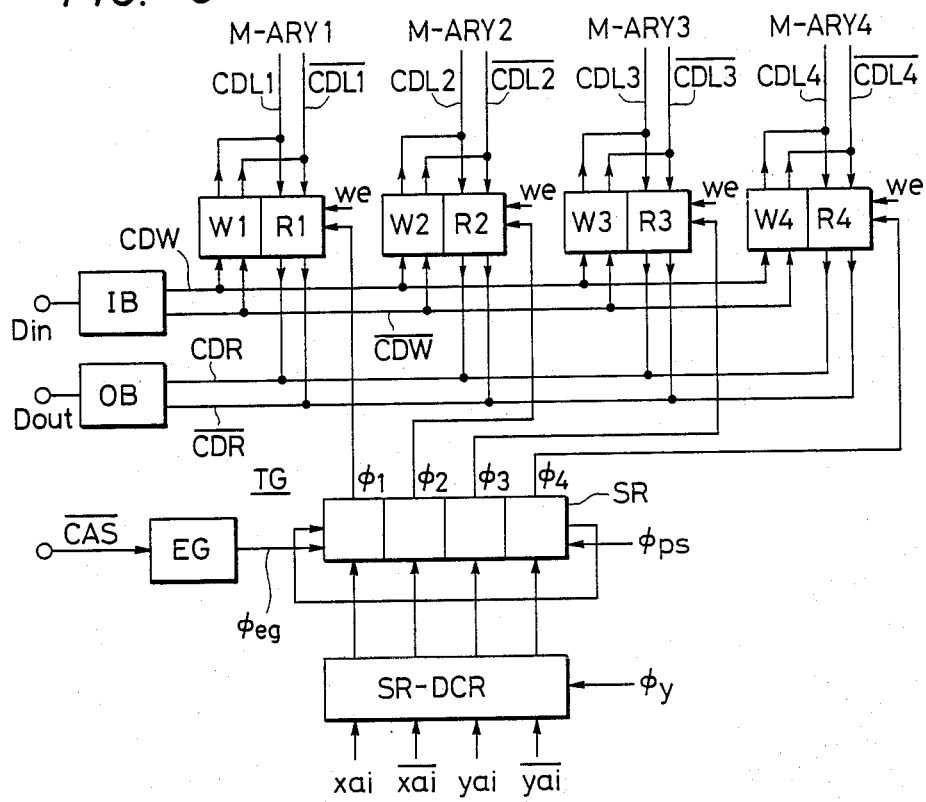
FIG. 3 is a block diagram showing a data output buffer, a data input buffer, and a portion of the timing generator circuit TG according to the embodiment.

FIG. 3 is a block diagram illustrating data output circuits R1 to R4, data input circuits W1 to W4 for realizing the nibble mode function to serially write or read the data consisting of four bits, and a part of a timing generator TG for controlling their operations, according to an embodiment of the present invention.

According to this embodiment, though there is no particular limitation, there are provided four memory arrays MARY1 to MARY4, four read circuits or read amplifiers R1 to R4 that amplify read signals obtained on the pairs of common complementary data lines CDL1, $\overline{CDL1}$ to CDL4, $\overline{CDL4}$, and four write circuits or write amplifiers W1 to W4 that supply write signals to the pairs of common complementary data lines CDL1, $\overline{CDL1}$ to CDL4, $\overline{CDL4}$. The output signals of the read amplifiers R1 to R4 are sent to an external unit via a common output buffer OB. Write signals are supplied from an external unit to the input terminals of the write amplifiers via a common input buffer IB. The output buffer OB and the input buffer IB that are formed to work commonly as mentioned above, can preferably be made up of static circuits such as CMOS circuits, though there is no particular limitation.

In order to serially read or write the data consisting of four bits according to this embodiment, the read amplifiers R1 to R4 and the write amplifiers W1 to W4 are operated in time series in accordance with a read or write control signal we and timing signals $\phi_1$ to $\phi_4$ formed by the timing generator TG that will be described later. That is, when a write enable signal $\overline{WE}$ has the high level, the read amplifiers R1 to R4 are operated in time series according to the timing signals $\phi_1$ to $\phi_4$ formed by the timing generator TG. When the write enable signal $\overline{WE}$ has the low level, the write amplifiers W1 to W4 are operated in time series according to the timing signals $\phi_1$ to $\phi_4$ formed by the timing generator TG.

The read amplifier R1 is rendered operative when the timing signal $\phi_1$ assumes the high level under the condition where the write control signal we is assuming the low level. The read amplifier R1 under the operative condition produces, onto the complementary signal lines CDR and $\overline{CDR}$, a data signal corresponding to the data signal that is applied to the common complementary data lines CDL1 and CDL1 coupled to the memory array MARY1. The read amplifier R1 is rendered inoperative when the write control signal we has the high level, i.e., when the write operation mode is designated to the memory by an external write enable signal $\overline{WE}$ having the low level, and when the timing signal $\phi_1$ has the low level. The read amplifier R1 under the inoperative condition assumes a higher output impedance.

Figure 4:
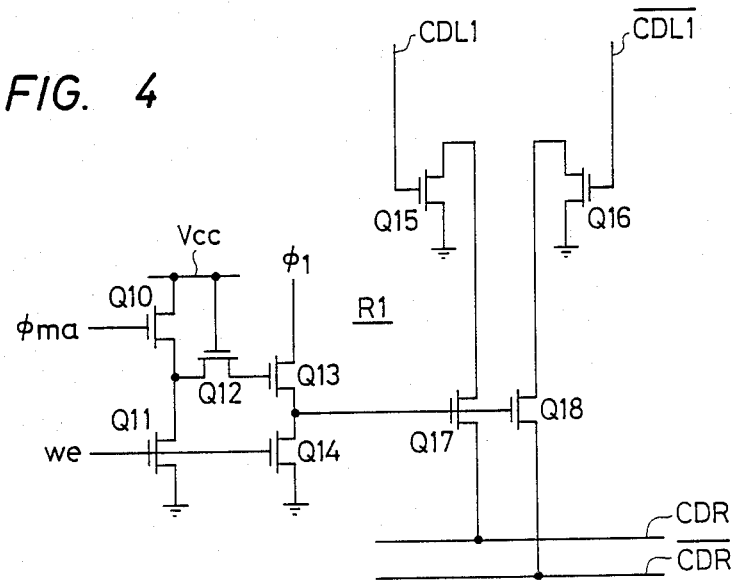
FIGS. 4 and 5 are circuit diagrams which concretely illustrate circuit blocks R1 and W1 of FIG. 3.

FIG. 4 concretely illustrates the circuit of the read amplifier R1 which consists of amplifying MOSFETs Q15, Q16 of which the gates are connected to the common complementary data lines CDL1, $\overline{CDL1}$, switching MOSFETs Q17, Q18, and MOSFETs Q10 to Q14 for controlling the switching MOSFETs Q17, Q18.

When the write control signal we has the high level, the MOSFETs Q11, Q14 are rendered conductive responsive thereto, and the gates of the switching MOSFETs Q17, Q18 are maintained at the low level which is close to zero volt. Therefore, the switching MOSFETs Q17 and Q18 are rendered nonconductive.

When the timing signals $\phi_{ma}$ and $\phi_1$ assume the high level under the condition where the write control signal we is assuming the low level, the switching MOSFETs Q17 and Q18 are rendered conductive responsive thereto. Therefore, the amplifying MOSFETs Q15 and Q16 are coupled to the complementary signal lines CDR, $\overline{CDR}$, respectively. The amplifying MOSFETs Q15 and Q16 are operated complementally by the data signal applied to the common complementary data lines CDL1, $\overline{CDL1}$. Therefore, either one of the pair of complementary signal lines CDR, $\overline{CDR}$ is forced to assume the low level which is close to zero volt.

When the data output buffer OB of FIG. 3 has no means to apply a potential to the complementary signal lines CDR and $\overline{CDR}$, pull-up resistance means (not shown) are provided between the power source terminal $V_{CC}$ of the circuit and each of the complementary signal lines CDR, $\overline{CDR}$.

The read amplifiers R2 to R4 of FIG. 3 are constructed in the same manner as the read amplifier R1.

The read amplifiers R1 to R4 are successively operated responsive to the timing signals $\phi_1$ to $\phi_4$ that are generated successively.

The write amplifier W1 is operated when the timing signal $\phi_1$ assumes the high level under the condition where the write signal we is assuming the high level. The write amplifier W1 under the operative condition applies to the common complementary data lines CDL1, $\overline{CDL1}$ a data signal that corresponds to the data signal supplied to the complementary signal lines CDW, $\overline{CDW}$. Therefore, the data signal corresponding to the external data signal $D_{in}$ is applied to the common complementary data lines CDL1 and $\overline{CDL1}$ via the input buffer IB and write amplifier W1. The write amplifier W1 is rendered inoperative when the write control signal we and the timing signal $\phi_1$ assume the low level. The write amplifier W1 under the inoperative condition assumes a high output impedance.

Figure 5:
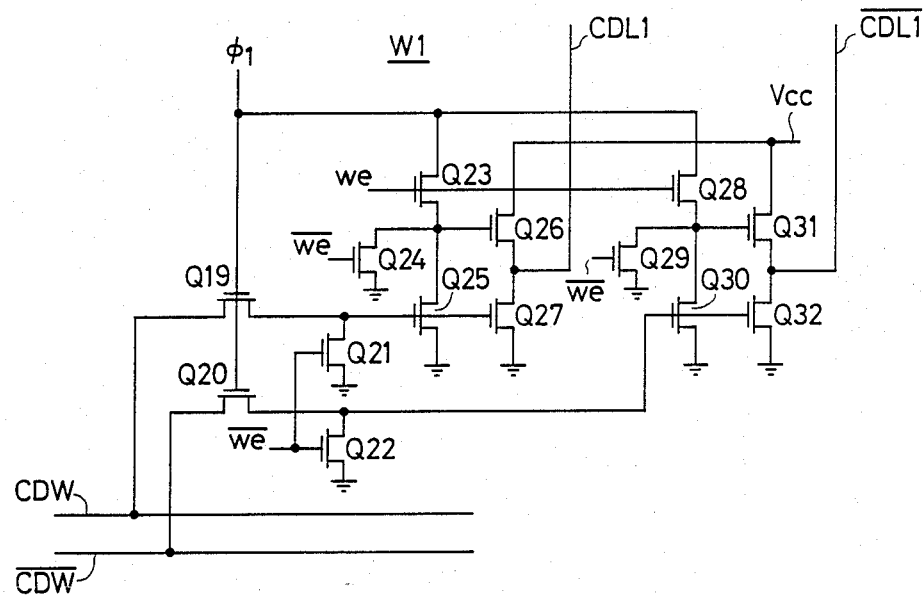

FIG. 5 concretely shows a circuit of the write amplifier W1.

When the write control signal we assumes the low level and the write control signal $\overline{we}$ assumes the high level, MOSFETs Q21, Q22, Q24 and Q29 are rendered conductive, and MOSFETs Q23, Q28 are rendered nonconductive. In this case, MOSFETs Q26, Q27, Q31 and Q32 constituting the output buffer are rendered nonconductive, since the potential close to zero volt is applied to the gates thereof through the MOSFETs Q21, Q22, Q24 and Q29. Under this condition, therefore, the potentials of the common complementary data lines CDL1 and $\overline{CDL1}$ are not changed by the write circuit W1.

When the control signals we and $\overline{we}$ are assuming the high level and the low level, respectively, the conductive state of the MOSFETs Q26, Q27, Q31 and Q32 is determined by the levels of complementary signal lines CDW and $\overline{CDW}$ of when the timing signal $\phi_1$ is generated. In this case, the circuit operates as described below.

It is now presumed that the complementary signal line CDW and $\overline{CDW}$ are assuming the high level and low level, respectively, due to the data input buffer IB of FIG. 3. As the timing signal $\phi_1$ assumes the high level, switching MOSFETs Q19 and Q20 are rendered conductive responsive thereto. Therefore, gates of MOSFETs Q25 and Q27 assume the high level responsive to the high level of the signal line CDW. The timing signal $\phi_1$ is supplied to the gate of the MOSFET Q26 via the MOSFET Q23. In this case, however, the gate of MOSFET Q26 is maintained at the low level which is close to zero volts, since the MOSFET Q25 has been rendered conductive by the potential of high level applied to the gate thereof. Gates of the MOSFETs Q30 and Q32 are maintained at the low level since the signal line $\overline{CDW}$ is assuming the low level. The timing signal $\phi_1$ is supplied to the gate of MOSFET Q31 via MOSFET Q28. In this case, since the MOSFET Q30 has been rendered nonconductive, the gate of MOSFET Q31 assumes the high level if the timing signal $\phi_1$ assumes the high level.

Accordingly, the common complementary data lines CDL1 and $\overline{CDL1}$ are forced to assume the low level and the high level, respectively.

The write amplifiers W2 to W4 are constructed in the same manner as the write amplifier W1. Therefore, the write amplifiers W1 to W4 are successively operated by the timing signals $\phi_1$ to $\phi_4$ that are successively generated.

Portions of the timing generator TG are constituted by an edge trigger circuit EG which receives the column address strobe signal $\overline{CAS}$, and a shift register SR. Concrete construction of the timing generator TG will be described later with reference to FIG. 6.

Though there is no particular limitation, the edge trigger circuit EG includes an exclusive-OR circuit EX1 for receiving the column address strobe signal $\overline{CAS}$ and its delay signal $\overline{CAS}'$ and detects the timing of change of the column address strobe signal $\overline{CAS}$. Incidentally, the edge trigger circuit EG is constructed not to respond to the first timing of change. The thus formed timing signal $\phi_{eg}$ is used as a shift clock for the shift register SR. The shift register SR has four bits, and the initial value thereof is set be a preset signal $\phi_{ps}$ and a decode signal produced by the address decoder SR-DCR which has received internal address signals $ax_i$, $\overline{ax_i}$, $ay_i$, $\overline{ay_i}$ corresponding to the external address signals XAi, YAi.

That is, when the timing signal $\phi_y$ is generated after the internal address signals $ax_i$, $\overline{ax_i}$, $\overline{ay_i}$ and $\overline{ay_i}$ have been produced by the address buffer ADB of FIG. 2, the address decoder SR-DCR is operated responsive thereto. Therefore, one bit among the four outputs of the address decoder SR-DCR assumes the high level (logic level "1"). Then, when the preset signal $\phi_{ps}$ is generated, output of the address decoder SR-DCR is preset to the shift register SR. Namely, among the four bits, one bit designated by the address signals XAi and YAi is set to the logic level "1" and the remaining three bits are set to the logic level "0", whereby the initial value of the shift register SR is set. The data of the logic level "1" is successively shifted rightwards according to the shift clocks $\phi_{eg}$, and the output of the final stage is fed back to the side of the initial stage. Therefore, four timing signals $\phi_1$ to $\phi_4$ are formed from each of the stages of the shift register SR, with these signals successively taking a "1" level in accordance with the rightward shift brought about by the signal $\phi_{eg}$. Which of the signals $\phi_1$ to $\phi_4$ has a "1" level first is determined by the address from SC-DCR set into the shift register SR when the present signal $\phi_{ps}$ operates the shift register SR to accept its initial value. The timing signals $\phi_1$ to $\phi_4$ are supplied to the corresponding amplifiers R1, W1 to R4, W4.

Figure 6:
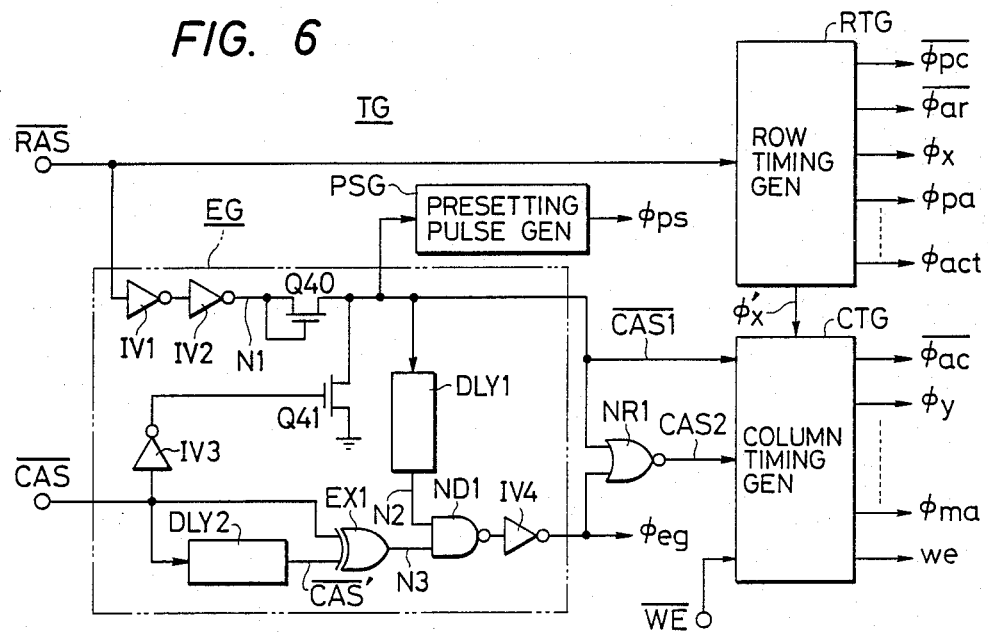
FIG. 6 is a block diagram which concretely illustrates the timing generator circuit.

FIG. 6 is a block diagram which concretely illustrates a preferred embodiment of the timing generator TG.

Though there is no particular limitation, the edge trigger circuit EG includes inverter circuits IV1 to IV4, an exclusive-OR circuit EX1, a NAND circuit ND1, delay circuits DLY1, DLY2, and MOSFETs Q40, Q41.

The delay circuit DLY2 and the exclusive-OR circuit EX1 constitute a detector circuit for detecting the transient condition of column address strobe signal $\overline{CAS}$. The delay circuit DLY2 has a delay time which is substantially equal to the pulse width of a detection pulse that is to be obtained. Therefore, when the column address strobe signal $\overline{CAS}$ changes as shown in FIG. 7B, the detection pulse N3 outputted from the exclusive-OR circuit EX1 changes as shown in FIG. 7H.

The inverter circuits IV1, IV2 and MOSFETs Q40, Q41 are constituting a column address strobe signal detector circuit.

If both the row address strobe signal $\overline{RAS}$ and the column address strobe signal $\overline{CAS}$ are maintained at the high level, the output N1 of the inverter circuit IV2 is maintained at the high level as shown in FIG. 7C. In this case, the diode-connected MOSFET Q40 is substantially rendered conductive, and the MOSFET Q41 is rendered nonconductive by the output (low level) of the inverter circuit IV3 which receives the column address strobe signal $\overline{CAS}$. Therefore, the signal $\overline{CAS1}$ assumes the high level as shown in FIG. 7D.

When the row address strobe signal $\overline{RAS}$ changes into the low level, the output of the inverter circuit IV2 changes into low level correspondingly as shown in FIG. 7C. At this movement, the MOSFET Q40 is rendered into the off state automatically. The signal CAS1 is maintained at the high level due to stray capacitance and parasitic capacitance that exist at the connection point of MOSFETs Q40 and Q41.

Then, when the column address strobe signal $\overline{CAS}$ changes into the low level as shown in FIG. 7B, the MOSFET Q41 is rendered into the on state correspondingly. This serves to discharge the voltage stored at the stray and parasitic capacitance at the junction of Q40 and Q41. Accordingly, the signal $\overline{CAS1}$ assumes the low level as shown in FIG. 7D. After this signal $\overline{CAS1}$ is maintained at the low level irrespective of the change in the level column address strobe signal $\overline{CAS}$ (presuming $\overline{RAS}$ remains at the low level). In other words, the signal CAS1 assumes the low level responsive to the initial fall of the signal CAS. The signal CAS1 will assume the high level again when both the signal $\overline{RAS}$ and the signal $\overline{CAS}$ assume the high level as shown in FIG. 7D.

The delay circuit DLY1 and the NAND circuit ND1 constitute a gate circuit. The delay circuit DLY1 has a function to delay and invert the signal $\overline{CAS1}$ to produce the signal N2. The delay circuit DLY1 has a delay time which is slightly greater than that of the delay circuit DLY2. Output N2 of the delay circuit DLY2 first assumes the low level as shown in FIG. 7E, and then assumes the high level after the signal $\overline{CAS1}$ has assumed the low level. By suitably setting the delay time of the delay circuit DLY1, the output N2 is allowed to assume the high level after the initial high-level period of the output N3 of exclusive-OR circuit EX1. The NAND circuit ND1 is opened by the output N2 of the high level.

Therefore the output $\phi_{eg}$, i.e., shift clock $\phi_{eg}$ of the NAND circuit ND1 obtained via the inverter circuit IV4, does not respond to the initial transient condition of the signal $\overline{CAS}$ as shown in FIG. 7I. The output $\phi_{eg}$ will, however, be produced after that in accordance with the N2 and N3 signals, as shown in FIG. 7I, to shift data in the shift register SR.

In FIG. 6, the present pulse generator PSG forms a preset signal $\phi_{ps}$ shown in FIG. 7F by detecting the fall of signal $\overline{CAS1}$. The preset signal $\phi_{ps}$ is supplied to the shift register SR of FIG. 3.

In FIG. 6, the row timing generator RTG receives the row address strobe signals $\overline{RAS}$ to form a variety of timing signals of the row system.

The timing signal $\overline{\phi_{pc}}$ assumes the high level when the signal $\overline{RAS}$ assumes the high level, and assumes the low level when the signal $\overline{RAS}$ assumes the low level. A precharging circuit (not shown) in the active restore circuit AR of FIG. 2 is operated by the timing signal $\overline{\phi_{pc}}$ of the high level, and raises the potential of the pair of data lines to a precharge level which is close to the power source voltage $V_{CC}$.

The timing signal $\overline{\phi_{ar}}$ assumes the low level when the signal $\overline{RAS}$ assumes the low level. As described above, the address buffer ADB is controlled for its operation by the timing signal $\overline{\phi_{ar}}$, and takes in address signals XA0 to XAi of the row system based on $\overline{\phi_{ar}}$.

The timing signal $\phi_x$ assumes the high level after the timing signal $\overline{\phi_{ar}}$ has assumed the low level. Therefore, the row decoder R-DEC is operated.

The timing signal $\phi_{pa}$ assumes the low level responsive to the signal $\overline{RAS}$ of the high level, and assumes the high level after the timing signal $\phi_x$ has assumed the high level. Therefore, the sense amplifier of FIG. 2 is operated after the word line is selected.

The timing signal $\phi_{act}$ assumes the low level responsive to the signal $\overline{RAS}$ of the low level, and assumes the high level after the timing signal $\phi_{pa}$ has assumed the high level. Therefore, the active restore circuit AR is operated after the data signal applied from the memory cell to the data lines DL1, $\overline{DL1}$, is amplified by the sense amplifier SA.

The signals $\overline{CAS1}$ and $\phi_{eg}$ produced by the edge trigger circuit EG of FIG. 6 are used for controlling the operation of the column timing generator CTG (noting the use of $\phi_{eg}$ and $\overline{CAS1}$ to produce CAS2 by NOR circuit NR1).

Upon receipt of the signal $\overline{CAS1}$ and a timing signal $\phi_x'$ of substantially the same phase as the timing signal $\phi_x$ produced by the row timing generator RTG, the column timing generator CTG produces a variety of timing signals.

The timing signal $\overline{\phi_{ac}}$ assumes the low level when the signal $\overline{CAS1}$ is changed into the low level. When the timing signal $\overline{\phi_{ac}}$ assumes the low level, the address buffer ADB takes in address signals YA0 to YAi of the column system.

As the signal $\overline{CAS1}$ assumes the low level, the timing signal $\phi_y$ assumes the high level after the timing signal $\phi_x'$ is produced from the row timing generator RTG. The column decoder C-DCR is operated by the timing signal $\phi_y$.

The timing signal $\phi_{ma}$ assumes the high level when a signal CAS2 produced by the NOR circuit NR1 assumes the high level as shown in FIG. 7K.

The main amplifier MA of FIG. 2 is operated by the timing signal $\phi_{ma}$.

Incidentally, the NOR circuit NR1 and a signal CAS2 produced therefrom are not necessary for the column timing generator CTG of this embodiment. If the output buffer OB and the input buffer IB of FIG. 3 are made up of dynamic circuits that include a precharging circuit, the signal CAS2 can be used to initiate the precharging of these circuits and to control the initiation of operation responsive to the transient column address strobe signal $\overline{CAS}$. However, the output N3 of the exclusive-OR circuit EX1 may be used in place of the signal CAS2. In this case, however, attention should be given to the below-mentioned point.

That is, the timing at which the output N3 changes into the low level is delayed by the delay time of delay circuit DLY2 with respect to the timing for changing the signal $\overline{CAS}$. Therefore, a slightly extended period of time is necessary after the signal $\overline{CAS}$ is changed to the low level first until the output N3 is changed to the low level. As a result, limitation is imposed on the response speed of the circuit with respect to the first fall of the signal $\overline{CAS}$. This does not occur if CAS2 is used since CAS2 is initiated by $\overline{CAS1}$ which is not delayed.

With regard to the above-described circuits PSG, RTG and CTG, it is to be noted that circuit implementation of these circuits to produce the various illustrated output timing signals in response to the various inputs can be accomplished in accordance with well-known logic circuit principles for producing timing outputs in response to predetermined inputs.

The reading operation of the circuit of this embodiment will be described below with reference to the timing chart of FIG. 7A-7K.

When the row address strobe signal $\overline{RAS}$ is changed to the low level, the addressing of the X stream is effected as described earlier, and a read signal appears on the data line DL. Then, when the column address strobe signal $\overline{CAS}$ is changed to the low level, the addressing of the Y system is effected as described earlier, whereby a memory cell is selected from each of the four memory arrays. Read signals from the memory cells are obtained on the pairs of common complementary data lines CDL1, $\overline{CDL1}$ to CDL4, $\overline{CDL4}$. Then, the circuit of, for example, the first stage of the shift register SR is set to the logic level "1" by the address signals XAi, YAi, and the timing signal $\phi_1$ is changed to the high level. When the write enable signal $\overline{WE}$ is maintained the high level (not shown), the read amplifier R1 is operated by the timing signal $\phi_1$. Therefore, the read signal is produced for the first time from the memory array MARY1 through the output buffer OB. Next, when the column address strobe signal $\overline{CAS}$ is changed to the high level, a shift clock $\phi_{eg}$ is produced by the edge trigger circuit EG responsive thereto, and the logic level "1" of the shift register SR is shifted to the next stage. Therefore, the timing signal $\phi_2$ is changed to the high level, and the read amplifier R2 operates instead of the read amplifier R1. A read signal responded to the memory array MARY2 is then produced from the output buffer OB. Similarly, the logic level "1" of the shift register SR is shifted every time when the column address strobe signal $\overline{CAS}$ changes. Therefore, the read signals responded to the memory arrays MARY3, MARY4 are produced successively. The memory array which reads the data for the first time is arbitrarily set by the address signals XAi, YAi.

As for the write operation, the write data are supplied to the external terminal $D_{in}$ in synchronism with the timing for changing the column address strobe signal $\overline{CAS}$. Then, the write amplifiers W1 to W4 are successively operated in the same manner as above, and the data is successively written onto the four memory arrays.

The circuit of this embodiment can be modified. For instance, the output buffer OB and the input buffer IB may be constituted by dynamic circuits that include the precharging circuit as described earlier. In this case, operations of the output buffer OB and the input buffer IB are controlled in their operations by the detection pulse CAS2 shown in FIG. 7K. Namely, these circuits OB, IB are precharged beforehand by the detection pulse CAS2 of the low level, and are operated when the change of level of column address strobe signal $\overline{CAS}$ is detected (i.e., operated by the signal CAS2 of the high level). In this case, since various nodes in the circuits OB and IB are preset to a reference level, these circuits operate without error even at timings at which the data signal applied thereto has not yet been amplified to a sufficiently large level. Furthermore, since the precharging or presetting has been executed, it is allowed to set constant the operation timing of the circuits OB and IB.

The output buffer OB and the input buffer IB need not be constituted by common circuits. For instance, the output buffer OB may have circuit portions that correspond to each of the read amplifiers R1 to R4.

FIG. 8 is a circuit digram of such a data output buffer OB according to another embodiment.

The amplified output signals from the read amplifiers (main amplifiers) R1 to R4 (see FIG. 3) are supplied to drive circuits DV1 to DV4 of the next stage, respectively. FIG. 8 illustrates the drive circuits DV1 and DV4 only as representative examples. Namely, the drive circuit DV1 is provided between a terminal which is served with the timing signal $\phi_1$ and a point of ground potential, and is constituted by MOSFETs Q10, Q12, Q11 and Q13 of the push-pull form to receive, in a crossing manner, the complementary data signals $d_{out1}$ and $\overline{d_{out1}}$ sent from the read amplifier R1. That is, the inverted output signal $\overline{d_{out1}}$ is supplied to the gates of MOSFETs Q10 and Q13, and the non-inverted output signal $d_{out1}$ is supplied to the gates of MOSFETs Q11 and Q12. Signals obtained from a connection point of the MOSFETs Q10 and Q12 and from a connection point of the MOSFETs Q11 and Q13, are supplied to the gates of output MOSFETs Q14, Q15 of the push-pull form in the next stage. Namely, the signal at the connection point of MOSFETs Q10 and Q12 is supplied to the gate of output MOSFET Q15 on the side of ground potential. The signal at the connection point of MOSFETs Q11 and Q13 is supplied to the gate of output MOSFET Q14 on the side of power source voltage $V_{CC}$.

Other drive circuits DV2 to DV4 and output circuits OB2 to OB4 are also constituted in the same manner as the above-mentioned circuits, and output terminals of the output circuits OB1 to OB4 are commonly connected or, in other words, constituted in a wired-or form and are connected to an output terminal $D_{out}$. The timing signals $\phi_1$ to $\phi_4$ supplied to the drive circuits DV1 to DV4 are formed by the timing generator TG of FIG. 3.

The timing generator TG forms the timing signals $\phi_1$ to $\phi_4$ in accordance with the changing timings of the column address strobe signal for successively designating memory arrays starting from a memory array which is firstly designated by address signals AXi and AYi of two bits at the time the preset signal $\phi_{ps}$ is generated. Therefore, as shown in the timing chart of FIGS. 7A–7K, the four drive circuits DV1 to DV4 are alternatively operated in accordance with the timing signals $\phi_1$ to $\phi_4$ formed by the timing generator TG. Therefore, the read signals are serially produced from the four memory arrays.

The drive circuits DV1 to DV4 that are rendered inoperative by the timing signals $\phi_1$ to $\phi_4$ of the low level, produce outputs of the low level. Therefore, the output buffers OB1 to OB4 assume the high-impedance state. Namely, output signals of the output buffers OB1 to OB4 are sent from the external output terminal $D_{out}$, the output buffers OB1 to OB4 receiving the signals supplied via the drive circuits DV1 to DV4 that are rendered operative by the timing signals $\phi_1$ to $\phi_4$ of the high level.

According to the present invention, the following effects are exhibited.

(1) Since the data can be written onto, or read out from, a plurality of memory arrays for every change in the column address strobe signal, the operation speed can be increased. For instance, when an output circuit which effects the precharging responsive to the column address strobe signal is provided in the read circuit or in the output buffer, a precharging period of about 30 ns is required. Therefore, a time of as long as about 330 ns is required to read the data consisting of four bits if plural memory arrays are read for each fall timing in the column address strobe signal. On the other hand, if plural memory arrays are read at every time for changing the column address strobe signal, the data can be read in about 240 ns.

(2) When the output buffer is used commonly for the read circuits that receive signals from a plurality of memory arrays, the data can be read at high speeds with a relatively simple circuit.

(3) When the signals from a plurality of memory arrays are produced by using drive circuits and output buffer circuits, the data consisting of a plurality of bits can be read out in series or in parallel by simply changing the circuit such that the drive circuits are operated in time series or simultaneously.

The invention accomplished by the inventor has been concretely described above by way of embodiments. It should, however, be noted that the invention is in no way limited to the above embodiments only, but can be modified in a variety of other ways without departing from the spirit and scope of the invention. For instance, the number of memory arrays and the number of peripheral circuits can be changed depending upon the requirements. Any circuit structure concretely illustrated with reference of FIG. 3 may be employed provided the aforementioned operations are carried out. In embodiment of FIG. 4, any drive circuit may be employed provided it renders the output circuit to assume the high-impedance condition during the inoperative period according to the timing signal, and supplies a signal of the main amplifier to the output circuit during the operative period.

The present invention can be widely applied to semiconductor memory devices that supply address signals in a multiplexed manner according to address strobe signals.

We claim:

1. A semiconductor memory comprising:
   a plurality a memory arrays each of which includes a plurality of dynamic memory cells;
   a plurality of read circuits coupled respectively to said memory arrays;
   a timing generator which detects every change in a column address strobe signal applied to said semiconductor memory, wherein said timing generator includes means to form timing signals in response to said detected changes; and
   a control circuit which, upon receipt of said timing signals, produces control signals to successively operate said plurality of read circuits so that said semiconductor memory successively produces output data in synchronism with every change in said column address strobe signal in read operation.

2. A semiconductor memory according to claim 1, wherein said control circuit is comprised of a shift register which receives said timing signals as shift pulses.

3. A semiconductor memory according to claim 1, wherein the dynamic memory cells included in each of said memory arrays are arranged in the form of a matrix, wherein each of said memory arrays further includes a plurality of word lines connected to select terminals of each of the dynamic memory cells, and a plurality of data lines connected to data input/output terminals of each of the dynamic cells for connecting said dynamic cells to said read circuits.

4. A semiconductor memory according to claim 3, wherein output terminals of said plurality of read circuits are commonly connected to each other.

5. A semiconductor memory according to claim 4, wherein said semiconductor memory further comprises a plurality of write circuits coupled to said memory arrays, said plurality of write circuits being successively operated by the control signals produced by said shift register.

6. A semiconductor memory comprising:
    a plurality of memory arrays each of which includes a plurality of dynamic memory cells;
    a plurality of read circuits coupled, respectively, to said memory arrays so that each memory array is coupled to a predetermined read circuit; and
    a timing generator for producing a plurality of control signals to successively operate said plurality of read circuits comprising:
    a shift register having a plurality of successive stages coupled, respectively, to said plurality of read circuits,
    a signal generator circuit coupled to said shift register for generating a plurality of shift signals to said shift register in response to detecting every change in a column address strobe signal applied to said semiconductor memory,
    wherein said shift signals operate said shift register to shift stages to successively operate said plurality of read circuits respectively coupled to said plurality of shift register stages in synchronism with every change in said column address strobe signal in read operation.

7. A semiconductor memory according to claim 6, further comprising means coupled to said shift register for setting an initial address into said shift register to select a predetermined one of said plurality of read circuits as the first read circuit to be operated when said signal generating circuit first detects said changes of said column address strobe signal.

8. A dynamic memory receiving first address signals in response to a predetermined change in a row address strobe signal and second address signals in response to a predetermined change in a column address strobe signal, said dynamic memory comprising:
    a plurality of memory arrays;
    a plurality of read circuits coupled, respectively, to said memory arrays so that each memory array is coupled to a predetermined read circuit;
    an output terminal coupled to receive output data read out from said plurality of memory arrays by said plurality of read circuits;
    a timing generator which detects every change in said column address strobe signal, wherein said timing generator includes means to form timing signals in response to said detected changes; and
    control means responsive to said timing signals for producing control signals to successively operate said plurality of read circuits so that said dynamic memory successively produces output data in synchronism with every change in said column address strobe signal in read operation.

9. A dynamic memory according to claim 8, wherein each of said memory arrays is comprised of a plurality of dynamic memory cells arranged in the form of a matrix having memory cell rows and memory cell columns, a plurality of word lines each of which is formed along one of said memory cell rows and is connected to select terminals of the memory cells formed on one of said memory cell rows, and a plurality of data lines each of which is formed along one of said memory cell columns and is connected to data input/output terminals of predetermined ones of the memory cells formed on one of said memory cell columns and is connected to the read circuit corresponding to the memory array in which it is located.

10. A dynamic memory according to claim 9, further comprising selector means coupled to said word lines for selecting one of said word lines.

11. A dynamic memory receiving first address signals in response to a predetermined change in a row address strobe signal and second address signals in response to a predetermined change in a column address strobe signal, said dynamic memory comprising:
    mode determining means responsive to said row and column address strobe signals for determining a mode in said dynamic memory;
    a plurality of memory arrays;
    a plurality of read circuits coupled, respectively, to said memory arrays so that each memory array is coupled to a predetermined read circuit;
    an output terminal coupled to receive output data read out from said plurality of memory arrays by said plurality of read circuits;
    a timing generator which detects every change in said column address strobe signal and which forms timing signals in response to the detected changes, when said mode determining means indicates a predetermined mode; and
    control means responsive to said timing signals for producing control signals to successively operate said plurality of read circuits so that said dynamic memory successively produces output data in synchronism with every change in said column address strobe signal in read operation.

12. A dynamic memory according to claim 11, wherein each of said memory arrays is comprised of a plurality of dynamic memory cells arranged in the form of a matrix having memory cell rows and memory cell columns, a plurality of word lines each of which is formed along one of said memory cell rows and is connected to select terminals of the memory cells formed on one of said memory cell rows, and a plurality of data lines each of which is formed along one of said memory cell columns and is connected to data input/output terminals of predetermined ones of the memory cells formed on one of said memory cell columns and is connected to the read circuit corresponding to the memory array in which it is located.

13. A dynamic memory according to claim 12, further comprising selector means coupled to said word lines for selecting one of said word lines.

14. A dynamic memory according to claim 13, wherein said control means comprises a shift register which receives said timing signals as shift pluses.

15. A dynamic memory according to claim 14, further comprising a plurality of write circuits coupled to said memory arrays, said write circuits being successively operated by the control signals produced by said shift register.

* * * * *